United States Patent
Yang et al.

(10) Patent No.: US 8,865,520 B2
(45) Date of Patent: Oct. 21, 2014

(54) CARRIER BONDING AND DETACHING PROCESSES FOR A SEMICONDUCTOR WAFER

(75) Inventors: Kuo-Pin Yang, Kaohsiung (TW); Wei-Min Hsiao, Kaohsiung (TW); Cheng-Hui Hung, Kaohsiung (TW)

(73) Assignee: Advanced Semiconductor Engineering, Inc. (TW)

( * ) Notice: Subject to any disclaimer, the term of this patent is extended or adjusted under 35 U.S.C. 154(b) by 376 days.

(21) Appl. No.: 13/216,063

(22) Filed: Aug. 23, 2011

(65) Prior Publication Data

US 2012/0052654 A1 Mar. 1, 2012

(30) Foreign Application Priority Data

Aug. 27, 2010 (TW) .............................. 99128960 A (51) Int. Cl.
*H01L 21/00* (2006.01)
*H01L 21/20* (2006.01)
*H01L 21/30* (2006.01)
*H01L 21/46* (2006.01)
*H01L 21/48* (2006.01)
*H01L 21/683* (2006.01)

(52) U.S. Cl.
CPC ... *H01L 21/6835* (2013.01); *H01L 2221/68381* (2013.01); *H01L 21/486* (2013.01); *H01L 2221/68327* (2013.01); *H01L 21/6836* (2013.01); *H01L 2221/6834* (2013.01)
USPC ........... 438/107; 438/118; 438/459; 438/584; 257/E21.499; 257/E21.502; 257/E21.568

(58) Field of Classification Search
USPC .......... 438/107, 118, 459, 584; 257/E21.499, 257/E21.502, E21.568
See application file for complete search history.

(56) References Cited

U.S. PATENT DOCUMENTS

| | | | |
|---|---|---|---|
| 3,761,782 | A | 9/1973 | Youmans |
| 4,394,712 | A | 7/1983 | Anthony |
| 4,499,655 | A | 2/1985 | Anthony |
| 4,807,021 | A | 2/1989 | Okumura |
| 4,842,699 | A | 6/1989 | Hua et al. |
| 4,897,708 | A | 1/1990 | Clements |
| 4,982,265 | A | 1/1991 | Watanabe et al. |
| 5,166,097 | A | 11/1992 | Tanielian |

(Continued)

FOREIGN PATENT DOCUMENTS

| | | |
|---|---|---|
| JP | 2002246540 A | 8/2002 |
| JP | 2004228135 A | 8/2004 |

(Continued)

*Primary Examiner* — Mohsen Ahmadi
(74) *Attorney, Agent, or Firm* — Morgan Law Offices, PLC (57) ABSTRACT

The present invention provides a temporary carrier bonding and detaching process. A first surface of a semiconductor wafer is mounted on a first carrier by a first adhesive layer, and a first isolation coating disposed between the first adhesive layer and the first carrier. Then, a second carrier is mounted on the second surface of the semiconductor wafer. The first carrier is detached. Then, the first surface of the semiconductor wafer is mounted on a film frame. The second carrier is detached. The method of the present invention utilizes the second carrier to support and protect the semiconductor wafer, after which the first carrier is detached. Therefore, the semiconductor wafer will not be damaged or broken, thereby improving the yield rate of the semiconductor process. Furthermore, the simplicity of the detaching method for the first carrier allows for improvement in efficiency of the semiconductor process.

18 Claims, 11 Drawing Sheets

(56) References Cited

U.S. PATENT DOCUMENTS

| | | | |
|---|---|---|---|
| 5,191,405 A | 3/1993 | Tomita et al. |
| 5,229,647 A | 7/1993 | Gnadinger |
| 5,239,448 A | 8/1993 | Perkins et al. |
| 5,308,443 A | 5/1994 | Sugihara |
| 5,404,044 A | 4/1995 | Booth et al. |
| 5,615,477 A | 4/1997 | Sweitzer |
| 5,643,831 A | 7/1997 | Ochiai et al. |
| 5,998,292 A | 12/1999 | Black et al. |
| 6,276,599 B1 | 8/2001 | Ogawa |
| 6,329,631 B1 | 12/2001 | Yueh |
| 6,406,934 B1 | 6/2002 | Glenn et al. |
| 6,448,506 B1 | 9/2002 | Glenn et al. |
| 6,457,633 B1 | 10/2002 | Takashima et al. |
| 6,577,013 B1 | 6/2003 | Glenn et al. |
| 6,670,269 B2 | 12/2003 | Mashino |
| 6,699,787 B2 | 3/2004 | Mashino |
| 6,740,950 B2 | 5/2004 | Paek |
| 6,812,549 B2 | 11/2004 | Umetsu et al. |
| 6,815,348 B2 | 11/2004 | Mashino |
| 6,962,829 B2 | 11/2005 | Glenn et al. |
| 7,078,269 B2 | 7/2006 | Yamasaki et al. |
| 7,134,198 B2 | 11/2006 | Nakatani |
| 7,157,372 B1 | 1/2007 | Trezza |
| 7,215,032 B2 | 5/2007 | Trezza |
| 7,222,420 B2 | 5/2007 | Moriizumi |
| 7,238,590 B2 | 7/2007 | Yang et al. |
| 7,262,475 B2 | 8/2007 | Kwon et al. |
| 7,276,787 B2 | 10/2007 | Edelstein et al. |
| 7,285,434 B2 | 10/2007 | Yee et al. |
| 7,298,030 B2 | 11/2007 | McWilliams et al. |
| 7,334,326 B1 | 2/2008 | Huemoeller et al. |
| 7,365,436 B2 | 4/2008 | Yamano |
| 7,371,602 B2 | 5/2008 | Yee |
| 7,388,293 B2 | 6/2008 | Fukase et al. |
| 7,415,762 B2 | 8/2008 | Fukase et al. |
| 7,482,272 B2 | 1/2009 | Trezza |
| 7,508,057 B2 | 3/2009 | Shiraishi et al. |
| 7,508,079 B2 | 3/2009 | Higashi |
| 7,528,053 B2 | 5/2009 | Huang et al. |
| 7,538,033 B2 | 5/2009 | Trezza |
| 7,553,752 B2 | 6/2009 | Kuan et al. |
| 7,560,744 B2 | 7/2009 | Hsiao et al. |
| 7,598,163 B2 | 10/2009 | Callahan et al. |
| 7,605,463 B2 | 10/2009 | Sunohara |
| 7,625,818 B2 | 12/2009 | Wang |
| 7,642,132 B2 | 1/2010 | Huang et al. |
| 7,656,023 B2 | 2/2010 | Sunohara et al. |
| 7,659,202 B2 | 2/2010 | Trezza |
| 7,666,711 B2 | 2/2010 | Pagaila et al. |
| 7,678,685 B2 | 3/2010 | Sunohara et al. |
| 7,681,779 B2 | 3/2010 | Yang |
| 7,687,397 B2 | 3/2010 | Trezza |
| 7,691,747 B2 | 4/2010 | Lin et al. |
| 7,733,661 B2 | 6/2010 | Kossives et al. |
| 7,741,148 B1 | 6/2010 | Marimuthu et al. |
| 7,741,152 B2 | 6/2010 | Huang et al. |
| 7,741,156 B2 | 6/2010 | Pagaila et al. |
| 7,772,081 B2 | 8/2010 | Lin et al. |
| 7,772,118 B2 | 8/2010 | Yamano |
| 7,786,008 B2 | 8/2010 | Do et al. |
| 7,786,592 B2 | 8/2010 | Trezza |
| 7,795,140 B2 | 9/2010 | Taguchi et al. |
| 7,808,060 B2 | 10/2010 | Hsiao |
| 7,808,111 B2 | 10/2010 | Trezza |
| 7,811,858 B2 * | 10/2010 | Wang et al. ............... 438/113 |
| 7,816,265 B2 | 10/2010 | Wang |
| 7,842,597 B2 | 11/2010 | Tsai |
| 2002/0017855 A1 | 2/2002 | Cooper et al. |
| 2002/0094605 A1 | 7/2002 | Pai et al. |
| 2004/0124518 A1 | 7/2004 | Karnezos |
| 2004/0259292 A1 | 12/2004 | Beyne et al. |
| 2005/0189635 A1 | 9/2005 | Humpston et al. |
| 2005/0258545 A1 | 11/2005 | Kwon |
| 2006/0027632 A1 | 2/2006 | Akram |
| 2006/0197216 A1 | 9/2006 | Yee |
| 2007/0048896 A1 | 3/2007 | Andry et al. |
| 2007/0138562 A1 | 6/2007 | Trezza |
| 2007/0187711 A1 | 8/2007 | Hsiao et al. |
| 2008/0272486 A1 | 11/2008 | Wang et al. |
| 2009/0032928 A1 | 2/2009 | Chiang et al. |
| 2009/0039527 A1 | 2/2009 | Chan et al. |
| 2009/0140436 A1 | 6/2009 | Wang |
| 2009/0146297 A1 | 6/2009 | Badakere et al. |
| 2009/0166785 A1 | 7/2009 | Camacho et al. |
| 2009/0243045 A1 | 10/2009 | Pagaila et al. |
| 2009/0294959 A1 | 12/2009 | Chiang et al. |
| 2009/0302435 A1 | 12/2009 | Pagaila et al. |
| 2009/0302437 A1 | 12/2009 | Kim et al. |
| 2009/0309235 A1 | 12/2009 | Suthiwongsunthorn et al. |
| 2009/0321916 A1 | 12/2009 | Wang et al. |
| 2010/0059855 A1 | 3/2010 | Lin et al. |
| 2010/0065948 A1 | 3/2010 | Bae et al. |
| 2010/0133704 A1 | 6/2010 | Marimuthu et al. |
| 2010/0140737 A1 | 6/2010 | Lin et al. |
| 2010/0140751 A1 | 6/2010 | Tay et al. |
| 2010/0140752 A1 | 6/2010 | Marimuthu et al. |
| 2010/0140776 A1 | 6/2010 | Trezza |
| 2010/0148316 A1 | 6/2010 | Kim et al. |
| 2010/0187681 A1 | 7/2010 | Chen et al. |
| 2010/0197134 A1 | 8/2010 | Trezza |
| 2010/0227454 A1 | 9/2010 | Dohmae |
| 2010/0230759 A1 | 9/2010 | Yang et al. |
| 2010/0230760 A1 | 9/2010 | Hung |
| 2010/0230788 A1 | 9/2010 | Peng |
| 2010/0244244 A1 | 9/2010 | Yang |
| 2010/0276690 A1 | 11/2010 | Chen |
| 2010/0327465 A1 | 12/2010 | Shen et al. |
| 2010/0330788 A1 * | 12/2010 | Yu et al. ............... 438/514 |
| 2011/0033976 A1 * | 2/2011 | Di Cioccio et al. ............ 438/107 |
| 2011/0048788 A1 | 3/2011 | Wang et al. |
| 2011/0068437 A1 | 3/2011 | Chiu et al. |

FOREIGN PATENT DOCUMENTS

| | | |
|---|---|---|
| TW | 200607011 A | 2/2006 |
| TW | 200612539 A | 4/2006 |
| TW | 200834691 A | 8/2008 |

* cited by examiner

CARRIER BONDING AND DETACHING PROCESSES FOR A SEMICONDUCTOR WAFER

CROSS-REFERENCE TO RELATED APPLICATIONS

This application claims the benefit of Taiwan application Serial No. 099128960, filed 27 Aug. 2010, the subject matter of which is incorporated herein by reference.

BACKGROUND OF THE INVENTION

1. Field of the Invention

The present invention relates generally to semiconductor device manufacturing, and more particularly, to handling and transport of semiconductor wafers during manufacturing.

2. Description of the Related Art

Handling semiconductor wafers that are in an intermediate state of fabrication as they are transported from one manufacturing site to another requires extreme care such that damage to the wafers is prevented. Conventionally, wafer chucks are mounted on surfaces of the wafer or carrier. However, this process can damage the wafer particularly when the chucks are detached from the wafer. As efforts to reduce the thickness of semiconductor wafers continue, improved techniques for their handling and transport will become increasingly important.

SUMMARY OF THE INVENTION

One aspect of the disclosure relates to a method for handling a semiconductor wafer. In one embodiment, the method comprises attaching a first carrier to an active surface of the semiconductor wafer using a first adhesive, the first carrier including at least one recess extending partially into the first carrier and allowing a portion of the first adhesive to flow therein. In this embodiment, the method can further include attaching a second carrier to an inactive surface of the semiconductor wafer using a second adhesive. Preparatory to the step of attaching the second carrier to the inactive surface, the method can further comprise exposing a tip of at least one conductive pillar formed in the semiconductor wafer by removing a portion of the inactive surface; covering the exposed tips with a passivation layer; thinning the passivation layer so that the tips protrude from the passivation layer; and electroplating the tips. The first carrier can be detached from the semiconductor wafer by dissolving at least a portion of the first adhesive, including at least some of the first adhesive contained in the at least one recess; and removing the first carrier from the semiconductor wafer. The method can further comprise mounting the semiconductor wafer on a frame; transporting the semiconductor wafer using the frame; and after the transporting, detaching the second carrier from the semiconductor wafer.

Another aspect of the disclosure relates to a method for handling a semiconductor wafer. In one embodiment, the method comprises attaching a first carrier to an active surface of the semiconductor wafer using a first adhesive; exposing a tip of at least one conductive pillar formed in the semiconductor wafer by removing a portion of the inactive surface; covering the exposed tips with a passivation layer; thinning the passivation layer so that the tips protrude from the passivation layer; and attaching a second carrier to the inactive surface of the semiconductor wafer using a second adhesive. The second adhesive can be a thermal release adhesive or an ultraviolet light release adhesive, for example. In an embodiment, the method further comprises grinding a surface of the first carrier so as to make the first carrier thinner; and etching the first carrier so as to detach the first carrier. In another embodiment, the method alternatively comprises cutting at least one recess in the first carrier, the at least one recess penetrating into the first adhesive; dissolving at least a portion of the first adhesive, including at least some of the first adhesive contained in the at least one recess; and removing the first carrier from the semiconductor wafer. In another embodiment, the method alternatively comprises mounting a first chuck to hold the first carrier; mounting a second chuck to hold the second carrier; and under a sufficiently high temperature, moving the first chuck and the second chuck in opposite directions to detach the first carrier from the semiconductor wafer.

Another aspect of the disclosure relates to a method for handling a semiconductor wafer. In one embodiment, the method comprises attaching a first carrier to an active surface of the semiconductor wafer using a first adhesive, wherein a first isolation layer is disposed between the first adhesive and the first carrier. The method can further include the step of attaching a second carrier to an inactive surface of the semiconductor wafer using a second adhesive, wherein a second isolation layer is disposed between the second adhesive and the second carrier. In this embodiment, the isolation layers can include a hydrophobic material having a characteristic that the adhesion force between the isolation coating and the adhesive is weak, allowing relatively easy detachment.

Other aspects and embodiments of the invention are also contemplated. The foregoing summary and the following detailed description are not meant to restrict the invention to any particular embodiment but are merely meant to describe some embodiments of the invention.

BRIEF DESCRIPTION OF THE DRAWINGS

FIG. 22A to FIG. 25 illustrate a temporary carrier bonding and detaching process according to another embodiment of the present invention.

Common reference numerals are used throughout the drawings and the detailed description to indicate the same elements. The present invention will be more apparent from the following detailed description taken in conjunction with the accompanying drawings.

DETAILED DESCRIPTION OF THE INVENTION

Figure 1:
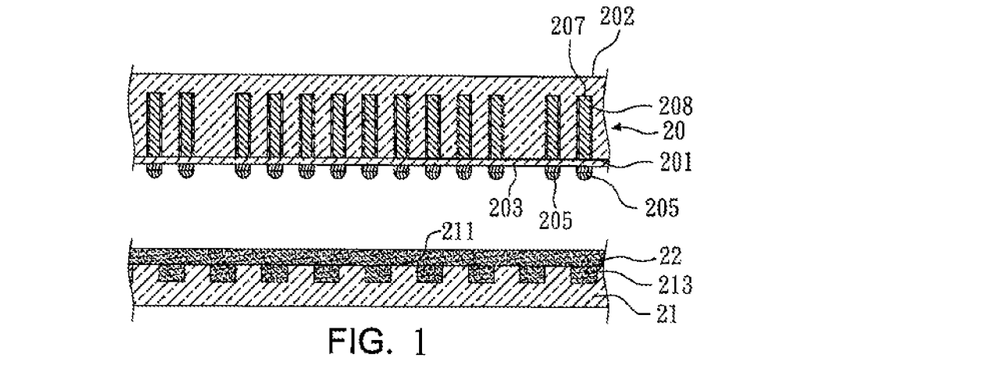
FIGS. 1-13 illustrate a temporary carrier bonding and detaching process according to an embodiment of the present invention.

Referring to FIG. 1, a semiconductor wafer 20 (shown in a cross-sectional view) being prepared for handling and transportation, according to an embodiment of the present invention is illustrated. The semiconductor wafer 20 has a first surface 201, a second surface 202 and a plurality of conductive pillars 207. The semiconductor wafer 20 can be made from silicon, germanium, gallium arsenide, etc. and the conductive pillars 207 made of a suitable conductive material such as copper. In this embodiment, the semiconductor wafer 20 can be fully fabricated to include an integrated circuit 203 and the conductive pillars 207 (as shown), or may be an interposer having only the conductive pillars 207. To avoid placing conductive metal directly on the semiconductor material, an insulation material 208, such as a non-conductive polymer, including polyimide (PI), epoxy or benzocyclobutene (BCB), or an inorganic material, such as, silicon dioxide ($SiO_2$), is formed between the semiconductor material and the conductive pillars 207.

In this embodiment, the integrated circuit 203, such as a CMOS circuit, is formed on the first surface 201 and may include a redistribution layer (RDL), and conductive elements 205 are formed on the integrated circuitry 203 and electronically connected to the conductive pillars 207.

Additionally, a first carrier 21 is provided, which can be a semiconductor material or insulating material such as glass. The first carrier 21 has at least one recess on a surface that will eventually be attached to the semiconductor wafer 20. In this embodiment, a plurality of recesses 213 are formed on a first surface 211 of the first carrier 21 but only extend partially into the first carrier 21. The recesses 213 may be of various shapes and are not limited to the rectangular shape illustrated in FIG. 1.

A first adhesive layer 22 is applied to the first surface 211 of the first carrier 21. A portion of the first adhesive layer 22 flows into the recesses 213. In this embodiment, the first adhesive layer 22 includes a solvent-dissolving adhesive. Exemplary solvent-dissolving adhesives include the X5000 and X5300 brands of adhesives by SUMITOMO CHEMICAL.

Figure 2:
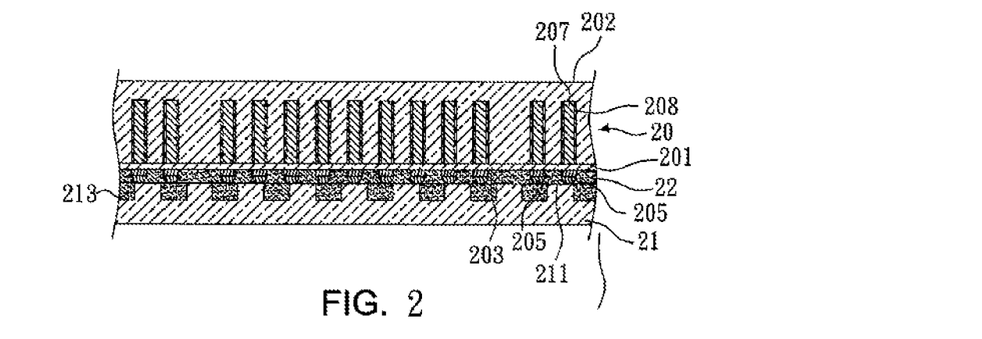

Referring to FIG. 2, the first surface 201 of the semiconductor wafer 20 is attached to the first carrier 21, and the semiconductor wafer 20 is adhered to the first carrier 21 by the first adhesive layer 22. In this embodiment, the conductive elements 205 are embedded into the first adhesive layer 22, the thickness of the first adhesive layer 22 is larger than the thickness of the conductive elements 205, and the pitch between two recesses 213 is greater than the pitch between the conductive elements 205 (e.g., the pitch between adjacent solder bumps).

Figure 3:
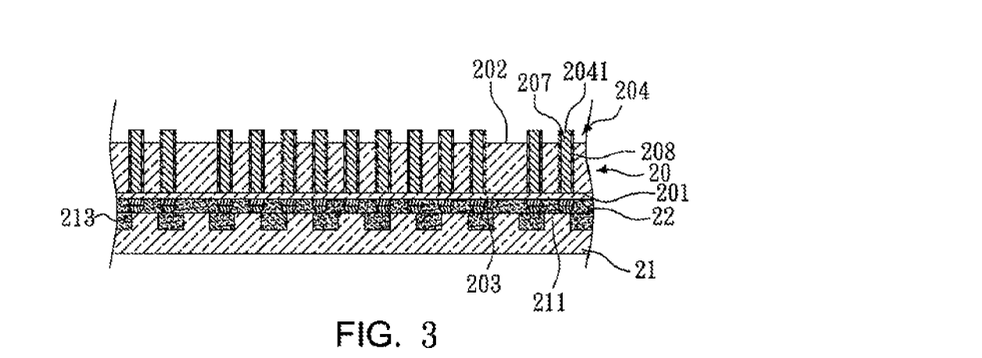

Referring to FIG. 3, a surface treatment is conducted on the second surface 202 of the semiconductor wafer 20. The second surface 202 of the semiconductor wafer 20 is thinned by grinding and/or etching, so that the conductive pillars 207 protrude from the upper surface of the semiconductor wafer 20, and a plurality of conductive vias 204 are formed. Thus, a tip 2041 of each of the conductive vias 204, which may include both portions of the insulation material 208 and conductive pillar 207, is exposed.

Figure 4:
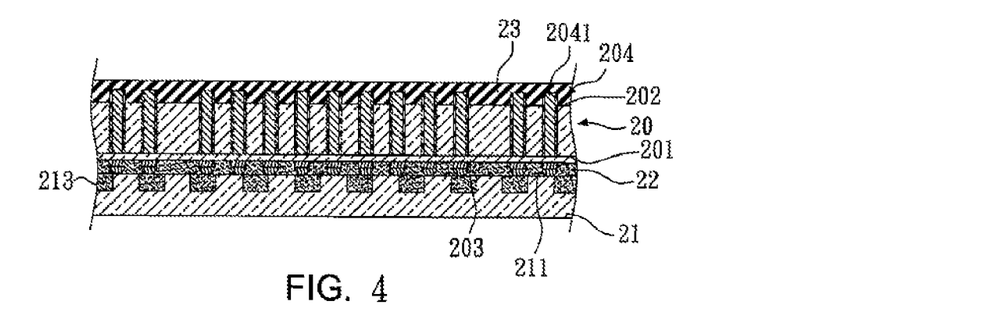

Referring to FIG. 4, a passivation layer 23 is formed on the second surface 202 by a laminating process or a spin coating process, for example, so as to cover the tips 2041 of the conductive vias 204. The passivation layer 23 may be a non-conductive polymer such as polyimide (PI), epoxy or benzocyclobutene (BCB); alternatively, an inorganic passivation layer, such as, silicon dioxide ($SiO_2$), may be used. In this embodiment, the passivation layer 23 can be a photo sensitive polymer such as benzocyclobutene, and can be formed by spin coating or spray coating.

Figure 5:
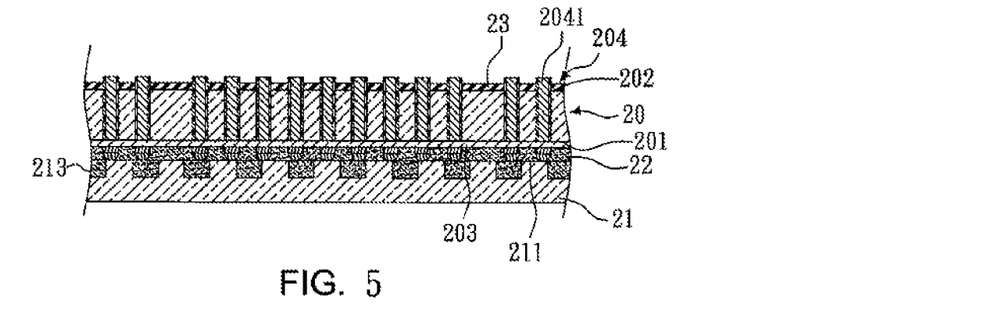

Referring to FIG. 5, the passivation layer 23 is thinned by grinding and/or etching, so that the tips 2041 of the conductive vias 204 protrude from the passivation layer 23. That is, portions of the passivation layer 23 remain on the second surface 202 of the semiconductor wafer 20 and fill in or interlace the areas between the tips 2041.

Figure 6:
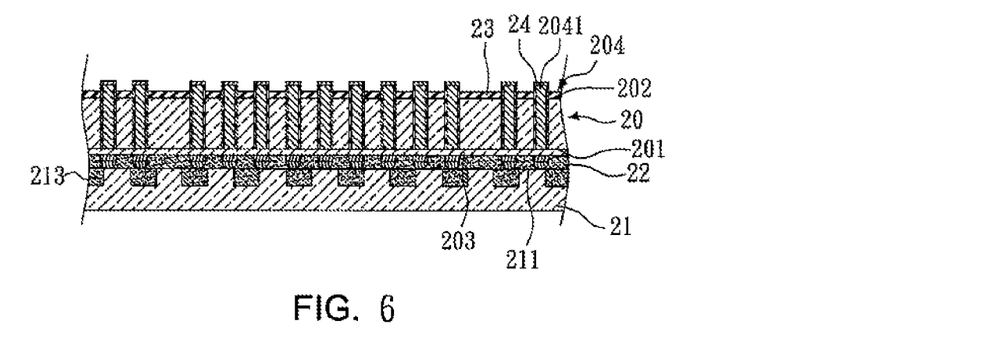

Referring to FIG. 6, a finish layer 24 is formed on the tips 2041 of the conductive vias 204 by electroplating. In this embodiment, the surface finish layer 24 is a metal layer, such as a nickel/gold (Ni/Au) layer.

Figure 7:
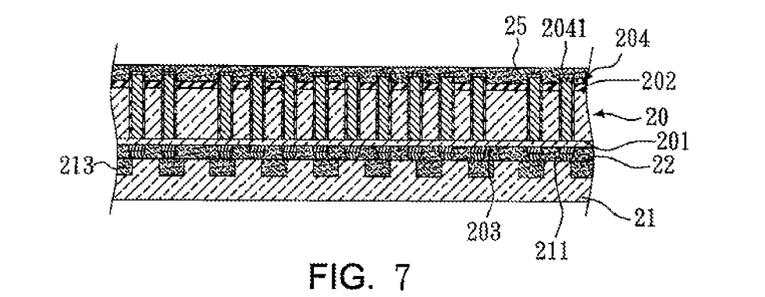

Referring to FIG. 7 a second adhesive layer 25 is formed over the plated tips 2041. In this embodiment, the second adhesive layer 25 may be a double-sided tape. The second adhesive layer 25 may be a thermal release adhesive and have a characteristic that its viscosity is reduced under a high temperature environment, such as the X5000 or X5300 brand adhesives of SUMITOMO CHEMICAL. However, alternatively, the second adhesive layer 25 may be an ultraviolet release adhesive and have a characteristic that its viscosity is reduced after being illuminated by ultraviolet light, such as the SELFA film of SEKISUI CHEMICAL.

Figure 8:
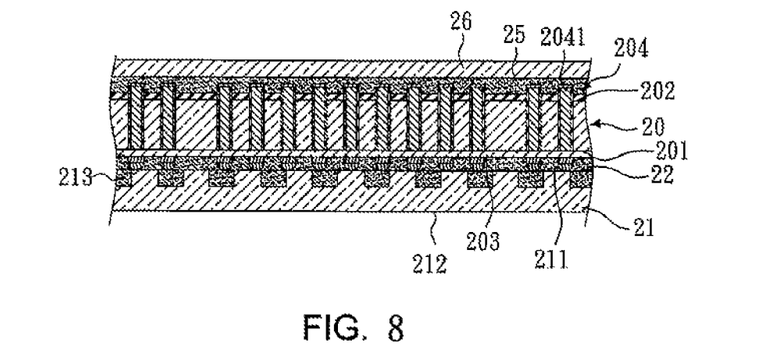

Then, in FIG. 8, a second carrier 26 is attached to the second adhesive layer 25. The second carrier 26 is a supporting body and may be cap-shaped, having a recess portion for accommodating the semiconductor wafer 20, or plate-shaped; and the second carrier 26 may be a transparent carrier, for example, glass.

Figure 9:
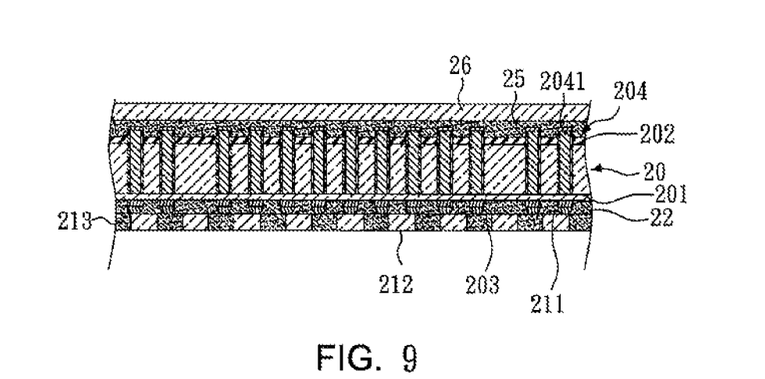

Referring to FIG. 9, the first carrier 21 is thinned from its exposed surface 212, by grinding so as to expose the recesses 213 of the first carrier 21. Then, the first carrier 21 and the first adhesive layer 22 are immersed in a solvent, for example, gamma-Butyrolactone (GBL) or Propylene Glycol Monomethyl Ether Acetate (PGMEA). The solvent penetrates the adhesive contained in the recesses to release or detach the remaining first carrier 21 segments from the semiconductor wafer 20. Thereupon, the first surface 201 of the semiconductor wafer 20 is exposed.

Figure 10:
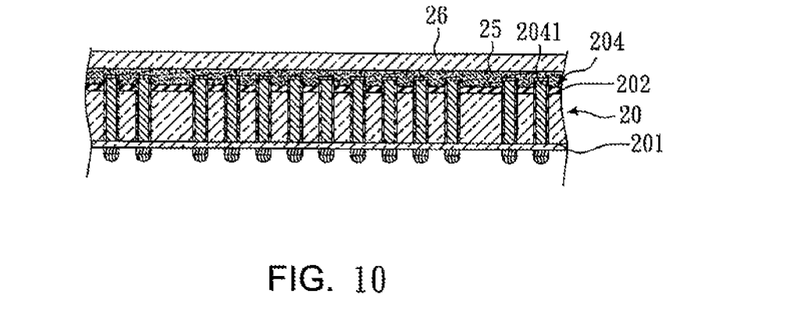

Referring to FIG. 10, after detaching the first carrier 21, some residual adhesive may remain on the first surface 201 of the semiconductor wafer 20. A cleaning process by a solvent will remove the residual adhesive after detaching the first carrier 21.

Figure 11:
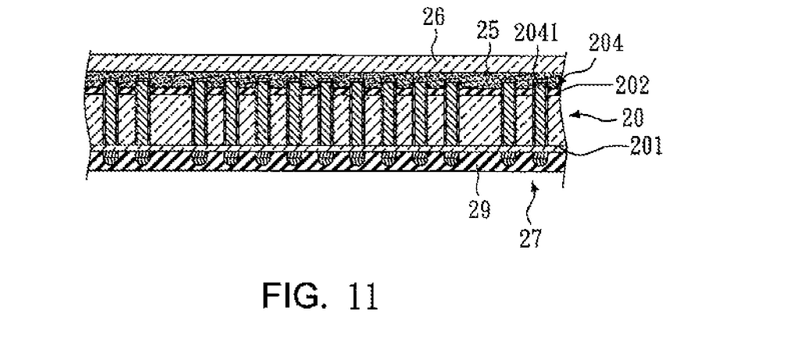

Referring to FIG. 11, the first surface 201 of the semiconductor wafer 20 is mounted on a film frame 27 for further transportation and then dicing. In this embodiment, the film frame 27 is a dicing frame and includes a stainless steel frame (not shown) and a dicing tape 29.

Figure 12:
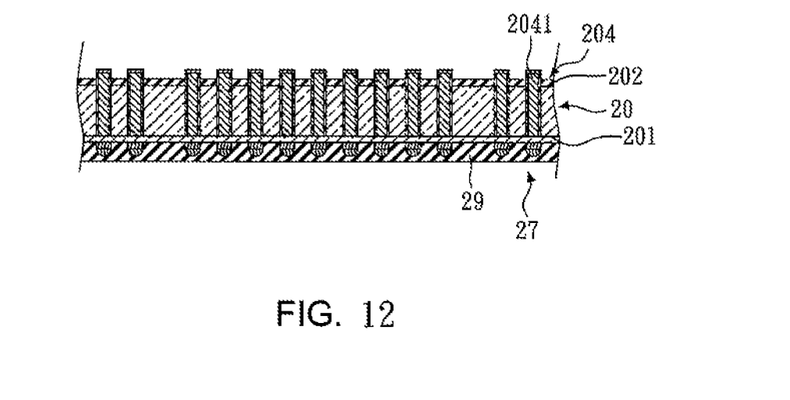

After the semiconductor wafer 20 is transported (e.g., transported to another manufacturing facility), referring to FIG. 12, the second carrier 26 is detached by a heating process. However, alternative methods for detaching the second carrier 26 may utilize an ultraviolet light illumination (e.g., where the second adhesive layer 25 is an ultraviolet release adhesive). The second adhesive layer 25 and the second carrier 26 may be detached simultaneously.

Figure 13:
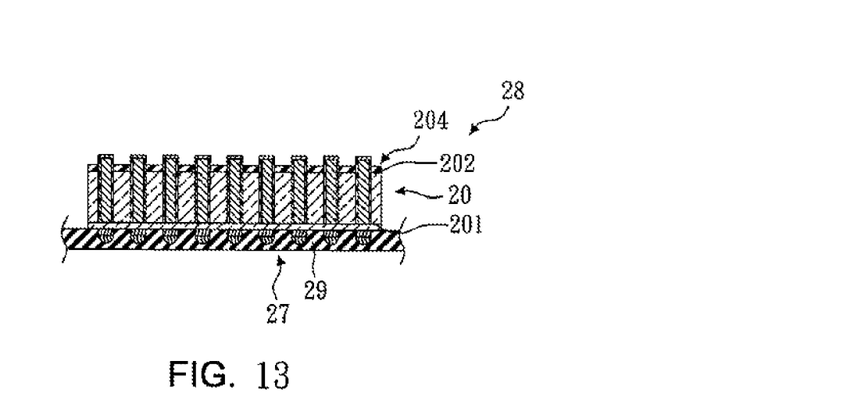

Referring to FIG. 13, the semiconductor wafer 20 is diced so as to form a plurality of semiconductor elements 28. The film frame 27 remains with the diced wafer 20 so as to permit the wafer to be handled and/or transported from one manufacturing station to another.

Advantageously, this embodiment utilizes the second carrier 26 to support and protect the semiconductor wafer 20 after the detaching of the first carrier 21. This enhanced handling process makes it less likely that the semiconductor wafer 20 will be damaged, thereby increasing the yield rate of the semiconductor process. Moreover, the support provided by the second carrier 26 facilitates the process of cleaning the residual adhesive 22. Furthermore, the exposed recesses 213 facilitate penetration of the solvent so as to improve the process of detaching the first carrier 21.

Figure 14:
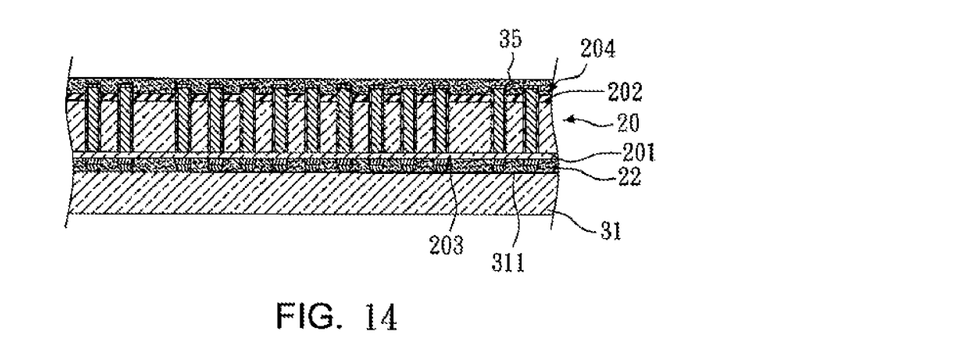
FIGS. 14-16 illustrate a temporary carrier bonding and detaching process according to another embodiment of the present invention.
Figure 15:
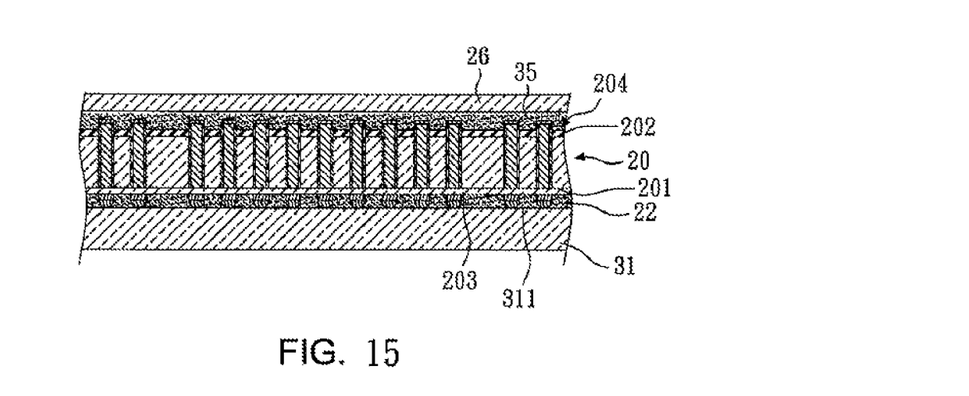
Figure 16:
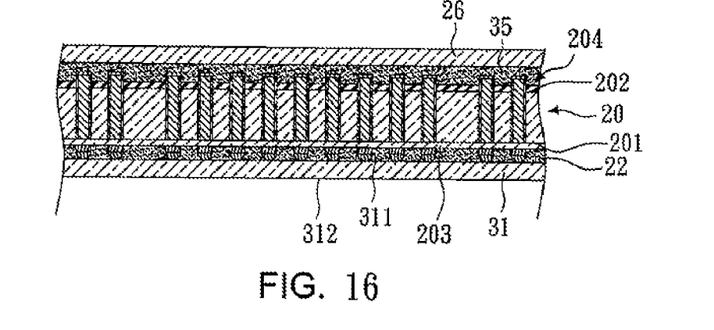

Referring to FIGS. 14 to 16, another embodiment of the present invention is illustrated. In this embodiment, the temporary carrier bonding and detaching process steps outlined above are substantially the same, the difference being that the carrier 31 used in this embodiment does not comprise a plurality of recesses. But similarly, the first adhesive layer 22 is coated on the first surface 311 of the first carrier 31, so that the semiconductor wafer 20 is adhered to the first carrier 31.

Referring to FIG. 15, a second carrier 26 is mounted on the second surface 202 of the semiconductor wafer 20 by a double-sided thermal release adhesive tape 35. In this embodiment, the second carrier 26 is mounted on the second surface 202 of the semiconductor wafer 20 by the double-sided thermal release adhesive tape 35; the second carrier 26 is a supporting body; the double-sided thermal release adhesive tape 35 may have a characteristic that its viscosity is reduced under a high temperature environment; and the second carrier 26 may be a semiconductor wafer.

Referring to FIG. 16, the first carrier 31 is detached. In this embodiment, the method for detaching the first carrier 31 comprises the following steps. A second surface 312, corresponding to the first surface 311, of the first carrier 31 is ground so as to make the first carrier 31 being thinner. Then, the first carrier 31 is further etched so as to detach the first carrier 31. After the detaching of the first carrier 31, the following step of cleaning residual adhesive is the same as described above.

After detaching the first carrier 31, the double-sided tape 35 and the second carrier 26 may be detached by conducting a high temperature process. The steps of cleaning residual adhesive, mounting on the film frame 27 and cutting can be the same as described above.

Figure 17:
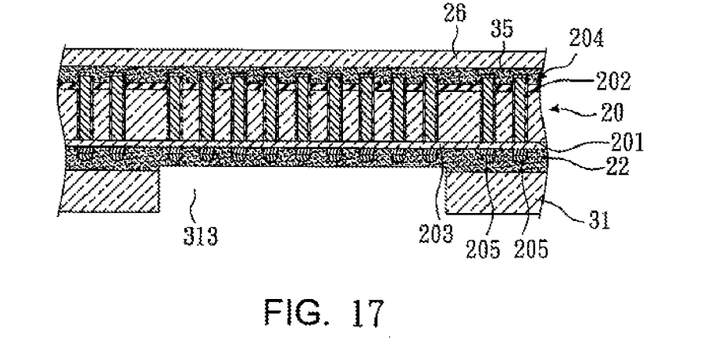
FIG. 17 illustrate a temporary carrier bonding and detaching process according to another embodiment of the present invention.

Referring to FIG. 17, another embodiment of the present invention is illustrated. This embodiment is similar to the processes described above; however, the steps of detaching the first carrier 31 are different. In this embodiment, a portion of the first carrier 31 is cut, so as to form at least one cutting recess 313 on the first carrier 31. The cutting recess 313 penetrates the first carrier 31 and a portion of the first adhesive layer 22 is exposed by the cutting recess 313. The cut first carrier 31 and the first adhesive layer 22 are then immersed into a solvent, for example, gamma-Butyrolactone (GBL) or Propylene Glycol Monomethyl Ether Acetate (PGMEA), and the solvent penetrates the portion of the first adhesive layer 22 exposed by the cutting recess 313, so that the first adhesive layer 22 dissolves from the cutting recess 313 allowing the first carrier 31 to be detached. Preferably, the first adhesive layer 22 will be sufficiently thick so as to have a cutting error tolerance such that part of the first adhesive layer 22 could be cut and the conductive element 205 not damaged.

After detaching the first carrier 31, the steps of cleaning residual adhesive, mounting on the film frame 27, detaching the second carrier 44 and cutting can be the same as in the process described above, and will not be described again.

Figure 18:
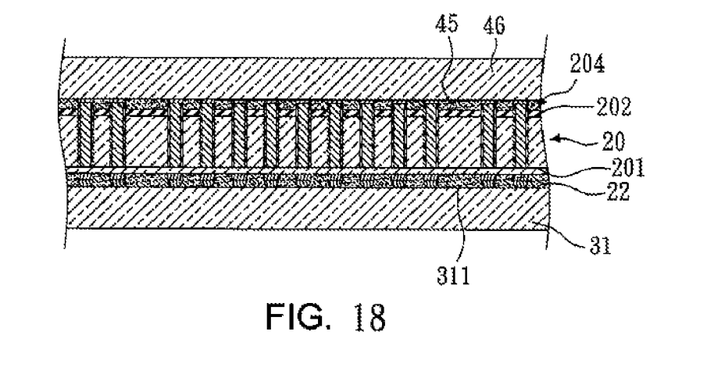
FIGS. 18 to 20 illustrate a temporary carrier bonding and detaching process according to another embodiment of the present invention.
Figure 19:
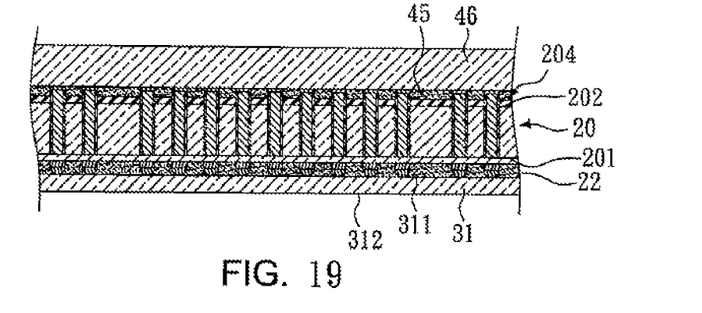
Figure 20:
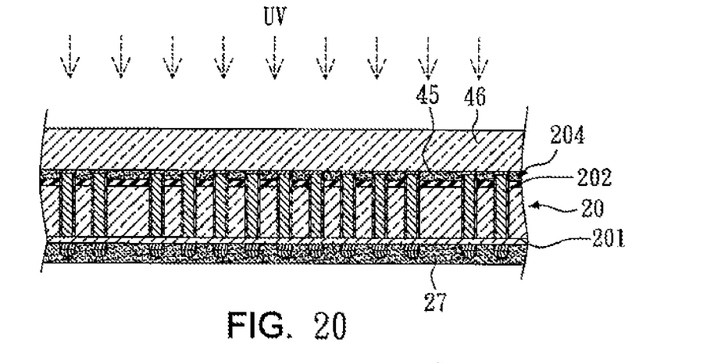

Referring to FIGS. 18 to 20, another embodiment of the present invention is illustrated. This embodiment involves a process that is similar to the processes described above. However, in this embodiment, the first adhesive layer 22 is coated on the first surface 311 of the first carrier 31, so that the semiconductor wafer 20 is adhered to the first carrier 31.

In this embodiment, a second carrier 46 is mounted on the second surface 202 of the semiconductor wafer 20 by a second adhesive layer 45. The second adhesive layer 45 may be a double-sided ultraviolet release tape, and have a characteristic that its viscosity is reduced after being illuminated by ultraviolet light, such as, SELFA brand film of SEKISUI CHEMICAL; the second carrier 46 is a transparent carrier, for example, glass.

Referring to FIG. 19, the first carrier 31 is thinned by grinding and then an etching process is conducted to detach the first carrier 31. After detaching the first carrier 31, the step of cleaning residual adhesive can be the same as described above. Referring to FIG. 20, the first surface 201 of the semiconductor wafer 20 is mounted on a film frame 27. The second carrier 46 is further detached. In this embodiment, the second carrier 46 is illuminated by ultraviolet light, the second carrier 46 is a transparent carrier, and the second adhesive layer 45 has a characteristic that its viscosity is reduced after being illuminated by ultraviolet light, so that the second adhesive layer 45 and the second carrier 46 may be detached.

However, in other embodiments of present invention, the second adhesive layer 45 may include a thermal release adhesive having a characteristic that its viscosity is reduced in a high temperature environment. The viscosity of the second adhesive layer 45 may be reduced by a heating process and the second adhesive layer 45 and the second carrier 46 then detached.

In another embodiment of the present invention, the second adhesive layer 45 is made of a different material from the first adhesive layer 22. For example, the first adhesive layer 22 could be a thermal release adhesive, such as the X5000 or X5300 adhesives of SUMITOMO CHEMICAL, while the second adhesive layer 45 could be an ultraviolet-released adhesive, such as the SELFA brand film of SEKISUI CHEMICAL. In this example, the first carrier 31 and the first adhesive layer 22 would be detached by a heating process, after mounting the first surface 201 of the semiconductor wafer 20 onto a film frame 27, and the transparent second carrier 46 and the second adhesive layer 45 would then be detached by ultraviolet light illumination. As another example, the first adhesive layer 22 could be an ultraviolet-released adhesive while the second adhesive layer 45 could be a thermal release adhesive. The first carrier 31 and the first adhesive layer 22 would be detached by illuminating ultraviolet light, and the second carrier 46 would be detached by a heating process. In yet another embodiment, first carrier 31 and the first adhesive layer 22 are detached by immersion into a first solvent, such as, gamma-Butyrolactone (GBL) or Propylene Glycol Monomethyl Ether Acetate (PGMEA), and the second carrier 46 is detached by illuminating ultraviolet light.

In another embodiment of the present invention, the second adhesive layer 45 and the first adhesive layer 22 are made of different thermal release adhesives. In an embodiment, the first adhesive layer 22 and the first carrier 31 are detached by heating at a first temperature, within 180 degree C. to 200 degree C., and the second adhesive layer 45 and the second carrier 46 are detached by heating at a second temperature within 220 degree C. to 240 degree C. In an embodiment, the second temperature is higher than the first temperature. In an embodiment, the temperature difference between the second temperature and the first temperature is at least 40 degree C.

In another embodiment of present invention, the first carrier 31 and the first adhesive layer 22 are immersed into a first solvent, such as, gamma-Butyrolactone (GBL) or Propylene Glycol Monomethyl Ether Acetate (PGMEA), to detach the first carrier 31, and the second adhesive layer 45 and the second carrier 46 are immersed into a second solvent, such as gamma-Butyrolactone (GBL) or Propylene Glycol Monomethyl Ether Acetate (PGMEA) to detach the second carrier 46. In an embodiment, the first solvent is the same with the second solvent In another embodiment, the first solvent may be different from the second solvent. In various embodiments, the second adhesive layer 45 is made of a different material from the first adhesive layer 22.

Figure 21:
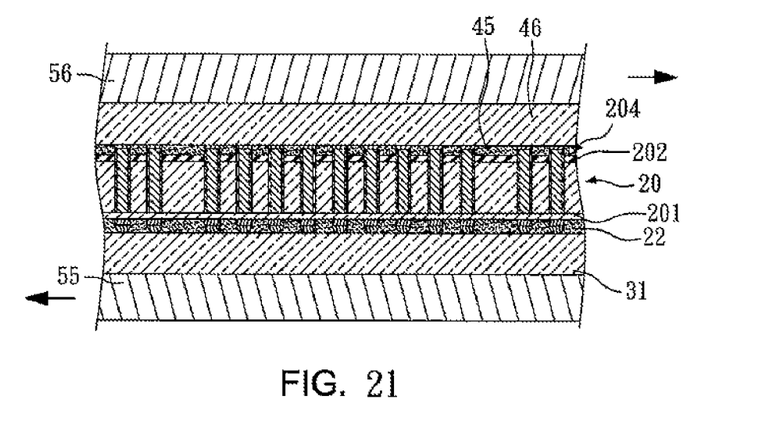
FIG. 21 illustrates a temporary carrier bonding and detaching process according to another embodiment of the present invention.
Figure 22A:
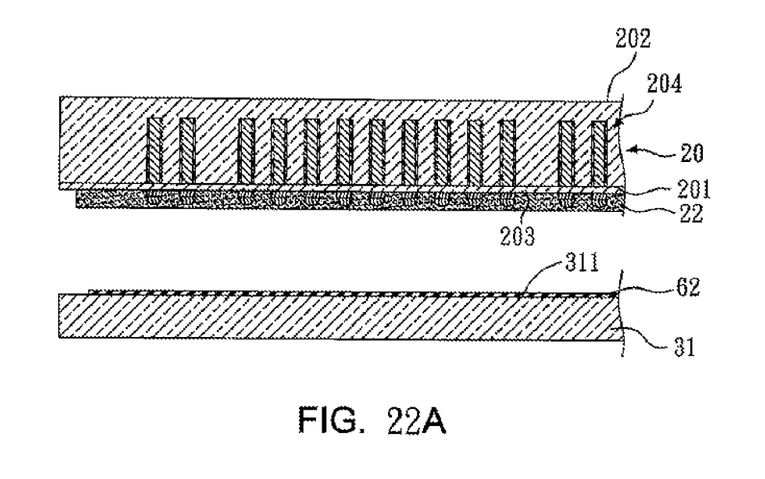
Figure 22B:
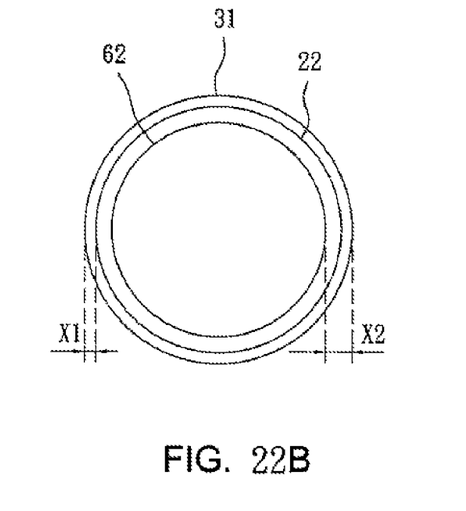

Referring to FIG. 21, another embodiment of the present invention is illustrated. This embodiment describes a process that is similar to the processes described above. The difference lies in the first carrier 31 detaching steps. In this embodiment, a first chuck 55 and a second chuck 56 are mounted to hold the first carrier 31 and the second carrier 46, respectively. The first adhesive layer 22 is a thermal release adhesive and has a characteristic that its viscosity is reduced under a high temperature environment, such as, the X5000 or X5300 adhesives of SUMITOMO CHEMICAL.

Under a high temperature environment, such as 180 degree C. to 200 degree C. or 220 degree C. to 240 degree C., the first chuck 55 and the second chuck 56 are moved in the opposite direction, and then the first adhesive layer 22 and the first carrier 31 are detached.

After detaching the first carrier 31, the steps of cleaning residual adhesive, mounting on the film frame 27, and detaching the second carrier 46 are the same as described above.

However, in another embodiment of the present invention, the first carrier 31 is still separated by the first chuck 55 and the second chuck 56, but the second carrier 46 is utilized to support and protect the second surface 102 of the semiconductor wafer 10, so the semiconductor wafer 20 will not be damaged or broken.

Referring to FIGS. 22A to 25, another embodiment of the present invention is illustrated. First, referring to FIG. 22A, the differences between this embodiment and the temporary carrier bonding and detaching process described above, are that the first carrier 31 further comprises a first isolation coating 62 formed between the first surface 311 of first carrier 31 and the first adhesive layer 22. In this embodiment, the first isolation coating 62 is a hydrophobic coating and has a characteristic that the adhesion force between the first isolation coating 62 and the first adhesive layer 22 is weak. The area of the first isolation coating 62 is slightly smaller than that of the first adhesive layer 22 as shown in FIG. 22B, the distance X2 between the edge of the first carrier 31 and the edge of the isolation coating 62 is slightly greater than the distance X1 between the edge of the first carrier 31 and the edge of the first adhesive layer 22. In this embodiment, the adhesion force with respect to the first adhesive layer 22 and the first carrier 31 is greater than the adhesion force with respect to the first adhesive layer 22 and the isolation coating 62. In this embodiment, the first carrier 31 may be a semiconductor wafer or glass and the first adhesive layer 22 a solvent-dissolving adhesive.

Figure 23:
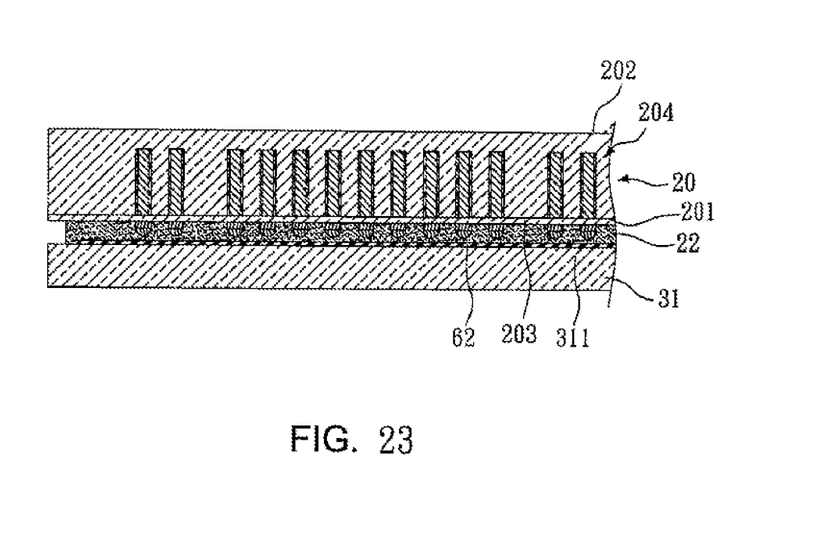

Referring to FIG. 23, the first surface 201 of the semiconductor wafer 20 is mounted on the first carrier 31, and the semiconductor wafer 20 is adhered to the first carrier 31 by the first adhesive layer 22. In this embodiment of the present invention, the steps of conducting a surface treatment on the second surface 202 of the semiconductor wafer 20 are substantially the same as those described above.

Figure 24:
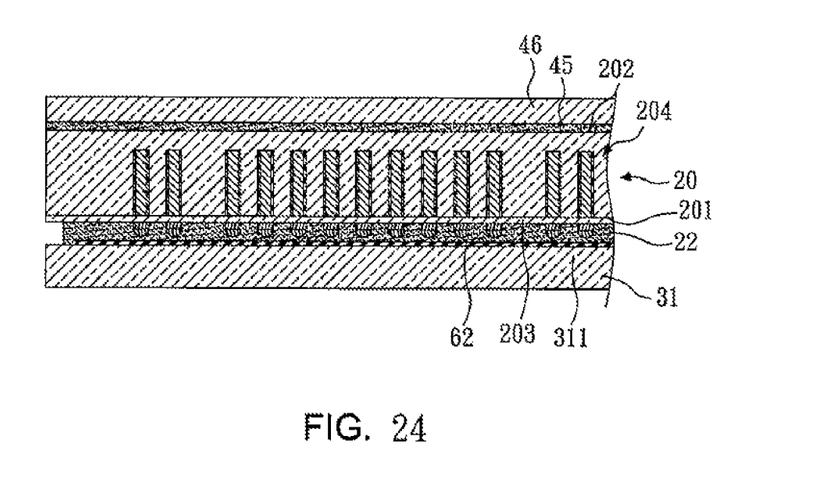

Referring to FIG. 24, a second carrier 46 is mounted on the second surface 202 of the semiconductor wafer 20 by a second adhesive layer 45. In this embodiment, the second carrier 46 is transparent, such as glass, and the second adhesive layer 45 is a double-sided ultraviolet release adhesive tape, a double-sided thermal release adhesive tape same as those described above, or a solvent dissolving adhesive same as the first adhesive layer 22.

Figure 25:
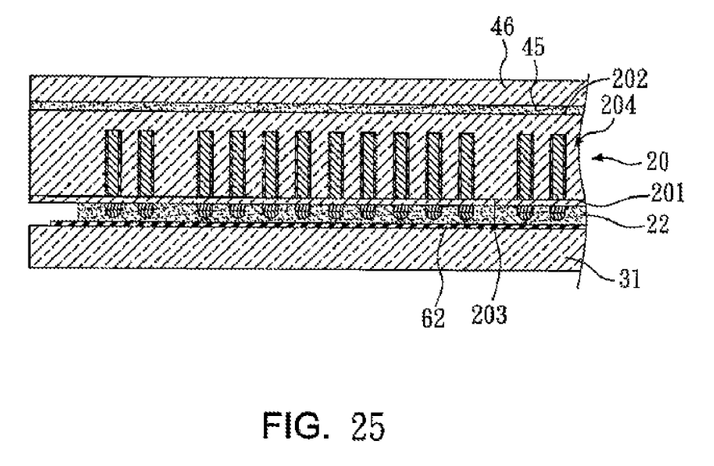

Referring to FIG. 25, the first carrier 31 and the first adhesive layer 22 are further immersed into a solvent, for example, gamma-Butyrolactone (GBL) or Propylene Glycol Monomethyl Ether Acetate (PGMEA), part of the first adhesive layer 22 is dissolved and the first isolation coating 62 is exposed. After that, the first carrier 31 and the isolation coating 62 are easily detached due to the weak adhesion force between the first adhesive layer 22 and the isolation coating 62. Then, the second adhesive layer 45 and the second carrier 46 can be immersed into the solvent to detach the second carrier 46.

However, in other embodiments, a cutting process can be used to detach the first carrier 31. After detaching the first carrier 31, the steps of cleaning residual adhesive, mounting on the film frame 27, detaching the second carrier 46 and cutting are as described above.

Figure 26:
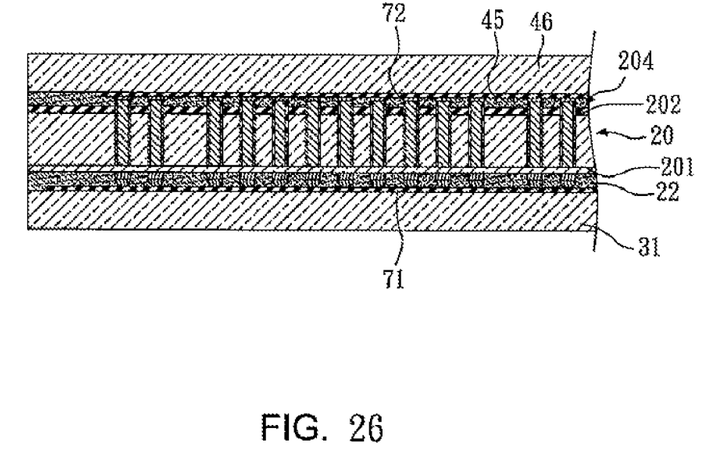
FIGS. 26 to 28 illustrate a temporary carrier bonding and detaching process according to another embodiment of the present invention.
Figure 27:
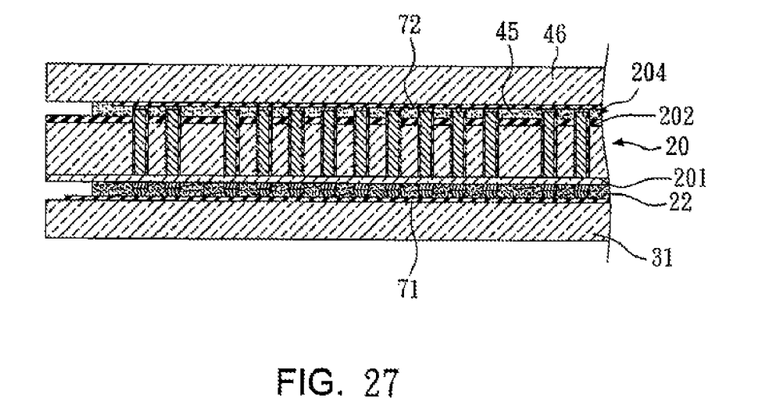
Figure 28:
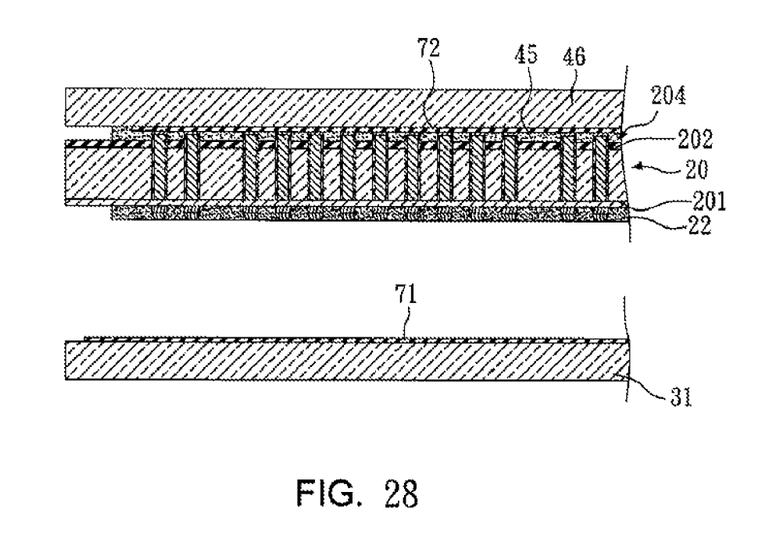

Referring to FIGS. 26 to 28, another embodiment of the present invention is illustrated. First, referring to FIG. 26, the differences between this embodiment of the present invention and the temporary carrier bonding and detaching process described above are that the second carrier 46 further comprises a second isolation coating 72 formed between the second carrier 46 and the second adhesive layer 45. In this embodiment, the second isolation coating 72 is a hydrophobic coating and has a characteristic that the adhesion force between the second isolation coating 72 and the second adhesive layer 45 is weak. The area of the second isolation coating 72 is slightly smaller than that of the second adhesive layer 45.

In this embodiment, both of the first adhesive layer 22 and the second adhesive layer 45 include solvent-dissolving adhesives which may be the same, and the area of the first adhesive layer 22 is substantially the same as the area of the second adhesive layer 45. The area of the second isolation coating 72 is smaller than that of the first isolation coating 71, and the area of the first isolation coating 71 is smaller than that of the first adhesive layer 22 and the second adhesive layer 45.

Referring to FIG. 27, the first carrier 31 and the second carrier 46 are immersed into a solvent, for example, gamma-Butyrolactone (GBL) or Propylene Glycol Monomethyl Ether Acetate (PGMEA). After part of the first adhesive layer 22 and the second adhesive layer 45 are dissolved, the first isolation coating 71 is exposed but the second resist film 72 is not exposed yet due to the area of the second isolation coating 72 is smaller than that of the first isolation coating 71. Therefore, due to the weak adhesion force between the first isolation coating 71 and the first adhesive layer 22, the first carrier 31 and the first isolation coating 71 can be removed easily as shown in FIG. 28. Further, the second carrier 46 may be detached by immersing into the solvent again.

While the invention has been described and illustrated with reference to specific embodiments thereof, these descriptions and illustrations do not limit the invention. It should be understood by those skilled in the art that various changes may be made and equivalents may be substituted without departing from the true spirit and scope of the invention as defined by the appended claims. The illustrations may not be necessarily be drawn to scale. There may be distinctions between the artistic renditions in the present disclosure and the actual apparatus due to manufacturing processes and tolerances. There may be other embodiments of the present invention which are not specifically illustrated. The specification and the drawings are to be regarded as illustrative rather than restrictive. Modifications may be made to adapt a particular situation, material, composition of matter, method, or process to the objective, spirit and scope of the invention. All such modifications are intended to be within the scope of the claims appended hereto. While the methods disclosed herein have been described with reference to particular operations performed in a particular order, it will be understood that these operations may be combined, sub-divided, or re-or-

What is claimed is:

1. A method for handling a semiconductor wafer, comprising:
attaching a first carrier to an active surface of the semiconductor wafer using a first adhesive, the first carrier including at least one recess extending partially into the first carrier and allowing a portion of the first adhesive to flow therein;
exposing a tip of at least one conductive pillar formed in the semiconductor wafer by removing a portion of the inactive surface;
covering the exposed tips with a passivation layer; and
thinning the passivation layer so that the tips protrude from the passivation layer.

2. The method of claim 1, further comprising:
attaching a second carrier to an inactive surface of the semiconductor wafer using a second adhesive.

3. The method of claim 2, further comprising:
electroplating the tips.

4. The method of claim 2, wherein the second adhesive is a thermal release adhesive.

5. The method of claim 2, wherein the second adhesive is an ultraviolet light release adhesive.

6. The method of claim 5, wherein the second carrier is substantially transparent.

7. The method of claim 2, wherein the first adhesive and the second adhesive are substantially different.

8. The method of claim 2, further comprising:
thinning the first carrier so as to expose the at least one recess;
dissolving at least a portion of the first adhesive, including at least some of the first adhesive contained in the at least one recess; and
removing the first carrier from the semiconductor wafer.

9. The method of claim 8, further comprising:
mounting the semiconductor wafer on a frame;
transporting the semiconductor wafer using the frame; and
after the transporting, detaching the second carrier from the semiconductor wafer.

10. The method of claim 1, wherein the first adhesive is a solvent-dissolving adhesive.

11. A method for handling a semiconductor wafer, comprising:
attaching a first carrier to an active surface of the semiconductor wafer using a first adhesive, wherein a first isolation layer made of a hydrophobic material is disposed between the first adhesive and the first carrier;
exposing a tip of at least one conductive pillar formed in the semiconductor wafer by removing a portion of the inactive surface;
covering the exposed tips with a passivation layer;
thinning the passivation layer so that the tips protrude from the passivation layer; and
attaching a second carrier to the inactive surface of the semiconductor wafer using a second adhesive, wherein a second isolation layer made of a hydrophobic material is disposed between the second adhesive and the second carrier.

12. The method of claim 11, further comprising:
grinding a surface of the first carrier so as to make the first carrier thinner; and
etching the first carrier so as to detach the first carrier.

13. The method of claim 11, wherein the second carrier is substantially transparent and the second adhesive is an ultraviolet light release adhesive.

14. The method of claim 11, further comprising:
cutting at least one recess in the first carrier, the at least one recess penetrating into the first adhesive;
dissolving at least a portion of the first adhesive, including at least some of the first adhesive contained in the at least one recess; and
removing the first carrier from the semiconductor wafer.

15. The method of claim 11, wherein the first adhesive is a thermal release adhesive, and further comprising:
mounting a first chuck to hold the first carrier;
mounting a second chuck to hold the second carrier; and
under a sufficiently high temperature, moving the first chuck and the second chuck in opposite directions to detach the first carrier from the semiconductor wafer.

16. A method for handling a semiconductor wafer, comprising:
attaching a first carrier to an active surface of the semiconductor wafer using a first adhesive, wherein a first isolation layer is disposed between the first adhesive and the first carrier;
exposing a tip of at least one conductive pillar formed in the semiconductor wafer by removing a portion of the inactive surface;
covering the exposed tips with a passivation layer; and
thinning the passivation layer so that the tips protrude from the passivation layer;
wherein the first isolation layer includes a hydrophobic material.

17. The method of claim 16, further comprising:
attaching a second carrier to an inactive surface of the semiconductor wafer using a second adhesive, wherein a second isolation layer is disposed between the second adhesive and the second carrier.

18. The method of claim 17, wherein the second isolation layer includes a hydrophobic material.

* * * * *